(12) United States Patent
Suzuki

(10) Patent No.: US 11,749,358 B2
(45) Date of Patent: Sep. 5, 2023

(54) SEMICONDUCTOR INTEGRATED CIRCUIT, SEMICONDUCTOR STORAGE DEVICE, AND CONTROL METHOD

(71) Applicant: Kioxia Corporation, Tokyo (JP)

(72) Inventor: Tomoaki Suzuki, Chigasaki (JP)

(73) Assignee: Kioxia Corporation, Tokyo (JP)

(*) Notice: Subject to any disclaimer, the term of this patent is extended or adjusted under 35 U.S.C. 154(b) by 275 days.

(21) Appl. No.: 17/347,914

(22) Filed: Jun. 15, 2021

(65) Prior Publication Data
US 2022/0199171 A1    Jun. 23, 2022

(30) Foreign Application Priority Data

Dec. 17, 2020    (JP) .................................. 2020-209460

(51) Int. Cl.
| | | |
|---|---|---|
| *G11C 16/04* | (2006.01) | |
| *G11C 16/32* | (2006.01) | |
| *G11C 16/08* | (2006.01) | |
| *G06F 3/06* | (2006.01) | |
| *H03L 7/08* | (2006.01) | |

(52) U.S. Cl.
CPC ............ *G11C 16/32* (2013.01); *G06F 3/0611* (2013.01); *G06F 3/0659* (2013.01); *G06F 3/0688* (2013.01); *G11C 16/08* (2013.01); *H03L 7/08* (2013.01)

(58) Field of Classification Search
CPC .................................. G11C 16/32; G11C 16/08
See application file for complete search history.

(56) References Cited

U.S. PATENT DOCUMENTS

| | | | |
|---|---|---|---|
| 8,077,822 B2 | 12/2011 | Sun et al. | |
| 8,446,193 B2 | 5/2013 | Zhang et al. | |
| 11,257,556 B2* | 2/2022 | Nakajima | G11C 17/18 |
| 2011/0208990 A1* | 8/2011 | Zerbe | G06F 1/08 710/53 |
| 2013/0067258 A1* | 3/2013 | Furuya | G06F 1/3237 713/322 |

FOREIGN PATENT DOCUMENTS

| | | |
|---|---|---|
| JP | 5420641 B2 | 2/2014 |
| JP | 2014-518036 A | 7/2014 |
| JP | 2019-121927 A | 7/2019 |

\* cited by examiner

*Primary Examiner* — Pho M Luu
(74) *Attorney, Agent, or Firm* — Oblon, McClelland, Maier & Neustadt, L.L.P.

(57) ABSTRACT

A semiconductor integrated circuit includes a register, a first interface circuit, an oscillation circuit that generates a first clock, a pll circuit, a control circuit, and a second interface circuit. The register stores numerical information representing a data size. The first interface circuit receives, from a first device, a first timing signal for data transfer. Responding to receipt of the first timing signal, the control circuit inputs the first timing signal to the pll circuit and counts the number of toggles of the first timing signal. When a counted number of toggles of the first timing signal matches a value corresponding to the numerical information, the control circuit inputs the first clock to the pll circuit. The second interface circuit transmits, to a second device, the first timing signal or a second timing signal, which corresponds to a second clock generated based on the first clock by the pll circuit.

20 Claims, 7 Drawing Sheets

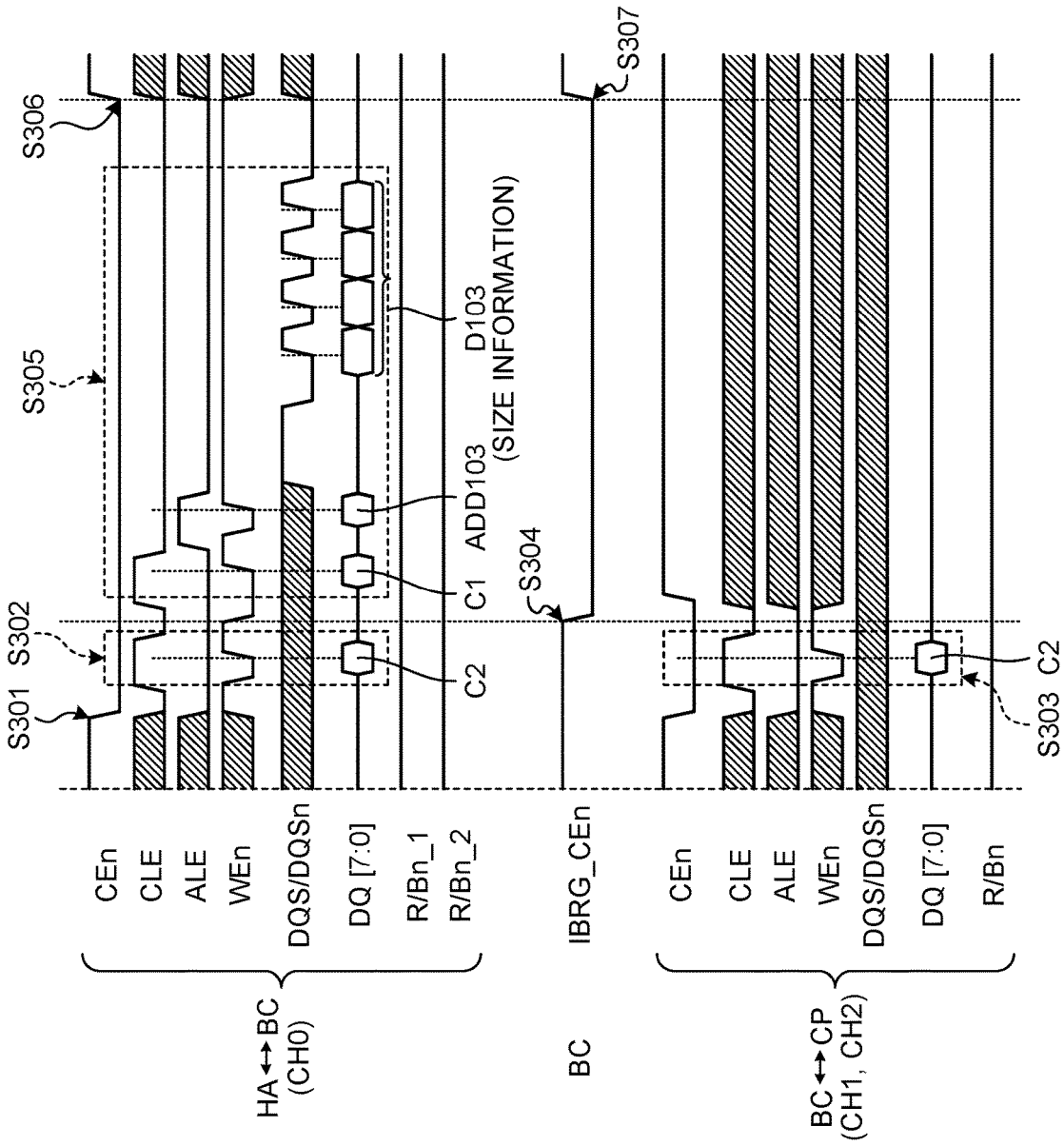

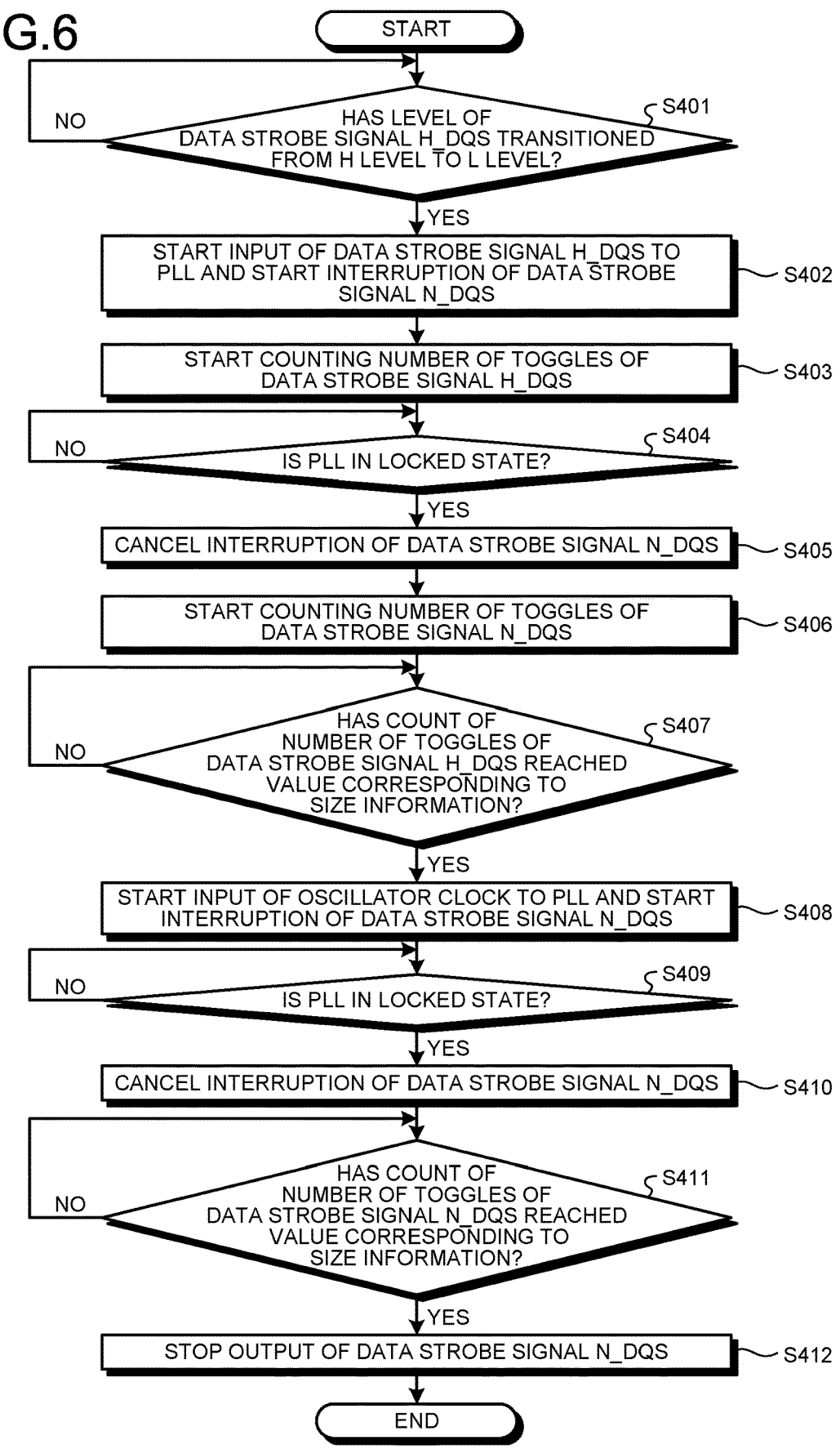

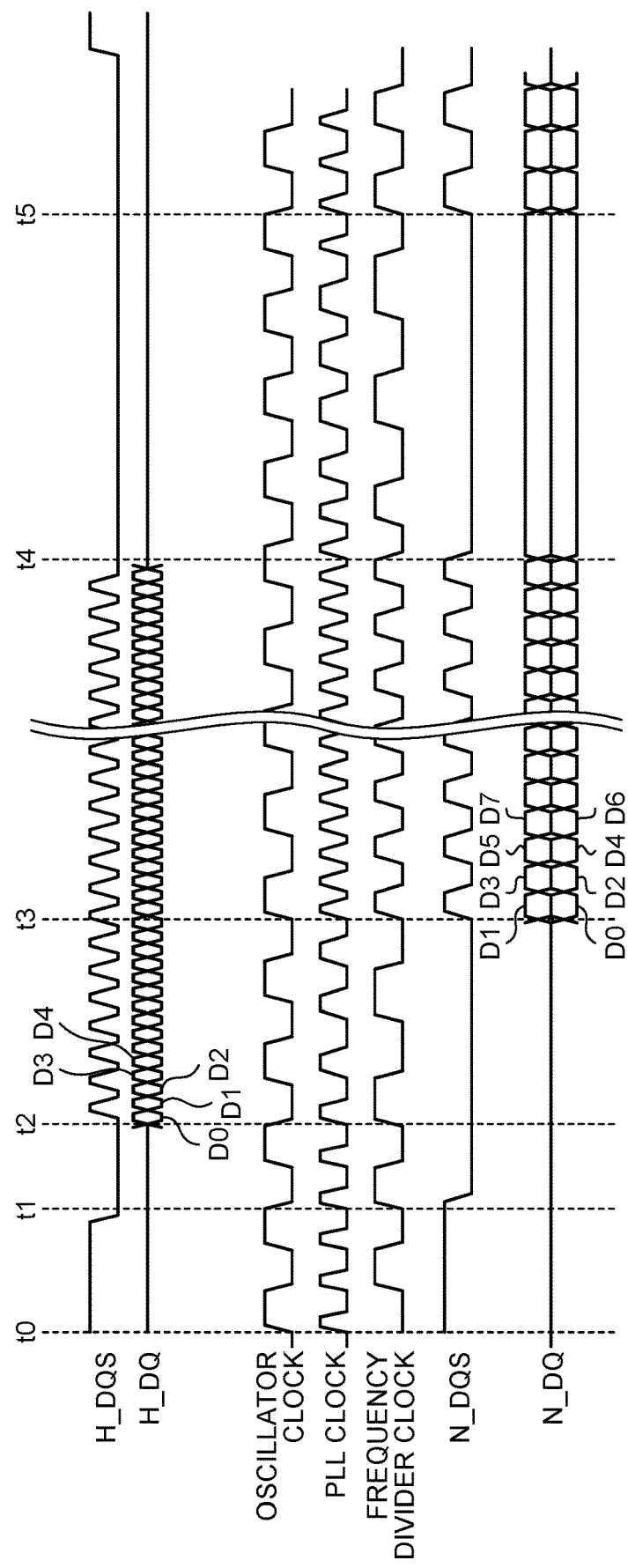

SEMICONDUCTOR INTEGRATED CIRCUIT, SEMICONDUCTOR STORAGE DEVICE, AND CONTROL METHOD

CROSS-REFERENCE TO RELATED APPLICATIONS

This application is based upon and claims the benefit of priority from Japanese Patent Application No. 2020-209460 filed on Dec. 17, 2020; the entire contents of which are incorporated herein by reference.

FIELD

Embodiments described herein relate generally to a semiconductor integrated circuit, a semiconductor storage device, and a control method.

BACKGROUND

Semiconductor storage devices are available, which include a plurality of memory chips, an external terminal group connected to a host, and a semiconductor integrated circuit called a bridge chip disposed between the memory chips and the external terminal group. In such a semiconductor storage device, data is transferred between the host and the memory chips via the bridge chip. At the time of data transfer between the host and the memory chips, the semiconductor storage device uses a timing signal such as a data strobe signal.

BRIEF DESCRIPTION OF THE DRAWINGS

FIG. 5 is a timing chart for explaining another exemplary operation of the semiconductor storage device in the bridge control mode according to an embodiment;

FIG. 6 is a flowchart illustrating an exemplary operation of a control circuit according to an embodiment; and FIG. 7 is a timing chart illustrating an example of a state transition of each signal during series of operations illustrated in FIG. 6 according to an embodiment.

DETAILED DESCRIPTION

Figure 1:
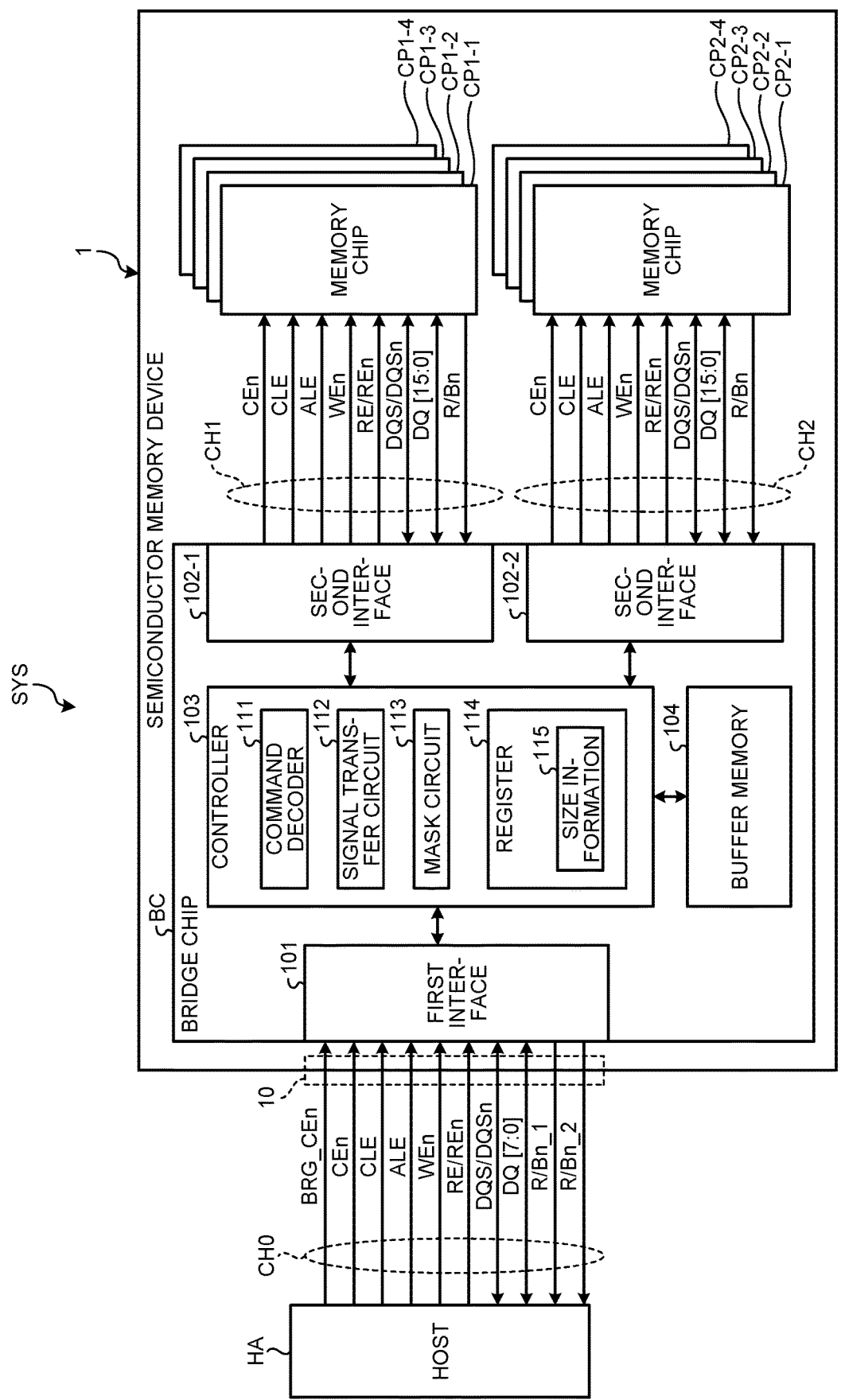
FIG. 1 is a schematic diagram illustrating an exemplary configuration of a storage system including a semiconductor storage device according to an embodiment.

According to one embodiment, in general, a bridge chip includes a register, a first interface circuit, an oscillation circuit, a phase-locked loop circuit, a control circuit, and a second interface circuit. The register stores numerical information representing a size of first data to be transferred between a first device and a second device. The first interface circuit receives, from the first device, a first timing signal for transfer of the first data. The oscillation circuit generates a first clock. The phase-locked loop circuit generates a second clock. In response to a start of toggling of the first timing signal, the control circuit inputs the first timing signal to the phase-locked loop circuit and counts the number of toggles of the first timing signal. The control circuit inputs the first clock to the phase-locked loop circuit when a count of the number of toggles of the first timing signal matches a value corresponding to the numerical information. The second interface circuit transmits the first timing signal or a second timing signal corresponding to the second clock to the second device.

Hereinafter, a semiconductor integrated circuit, a semiconductor storage device, and a control method according to embodiments will be described in detail with reference to the accompanying drawings. The following embodiments are presented for illustrative purposes only and unintended to limit the scope of the present invention

Embodiment

A semiconductor storage device according to an embodiment includes an external terminal connectable to a host, a bridge chip, and a plurality of memory chips. The bridge chip is connected to the external terminal, and is electrically connected to the host via the external terminal. The memory chips are electrically connected to the bridge chip. To connect the semiconductor storage device to the host, the external terminal is connected to the host via a wired communication channel. In the semiconductor storage device, the host accesses the memory chips through the bridge chip via the wired communication channel. Each memory chip is, for example, a nonvolatile memory chip such as a NAND flash memory.

In order to increase the storage capacity, the number of memory chips included in the semiconductor storage device has been increasing. For example, the packaging density can be improved by stacking the memory chips on the top of each other. For this purpose, to reduce an electrical load on the connection to each memory chip and to heighten the operation speed, the bridge chip and the memory chips may be connected to each other through a plurality of channels. Two or more memory chips can be connected to each channel.

Under a toggle double-data-rate (DDR) standard, for example, a timing signal called a data strobe signal may be used in data communication between two devices. The data strobe signal is transferred together with a data signal having a given bit width (for example, 8 bits) representing data and serves to instruct the device being a transmission destination of the data signal as to a timing at which the data signal is acquired. The number of times that the data strobe signal is toggled corresponds to a transfer length of the data, i.e., a size of transfer data.

That is, at a time of data transfer between the host and the memory chip, the data strobe signal may be transferred together with the data signal. In this case, jitter in the data strobe signal increases every time the data strobe signal passes through a logic circuit in a transmission path. If the bridge chip receives and transfers the data strobe signal from a transmission source (one of the host and the memory chip) to a transmission destination (the other of the host and the memory chip) as it is, the transmission destination receives the data strobe signal with a very large amount of jitter. Thereby, the memory chip may not be able to receive the data correctly.

In one embodiment, the bridge chip includes a phase-locked loop circuit (PLL). The PLL functions to divide a timing arc (in other words, a delay path) of the timing signal, so that the bridge chip can cancel the jitter in the data strobe signal. Specifically, the PLL generates a new clock by using, as a reference clock, the data strobe signal received from the transmission source, and transfers a new data strobe signal corresponding to the new clock to the transmission destination. As a result, the memory chip can receive the data strobe signal with less jitter, as compared with receiving that from the bridge chip including no PLL.

According to the toggle DDR standard, for example, the data strobe signal is transferred only during a transfer period of transfer data. That is, the PLL receives no reference clock while no transfer data is being transferred, therefore, the PLL cannot assure a quality of the clock to be output during that period.

The bridge chip further includes an oscillator in order to enable the PLL to output a high-quality clock during a period in which no transfer data is transferred. Specifically, the bridge chip uses the data strobe signal as the reference clock of the PLL while the transfer data is transferred, and uses the clock generated by the oscillator as the reference clock while the transfer data is not transferred.

In data transfer between the host and the memory chip, both the host and the memory chip can be a data transfer source. The data transfer source transfers the data strobe signal together with intended data. When the data strobe signal is considered as a timing signal to be suppressed in jitter, the transfer source of the data strobe signal, i.e., the host or the memory chip, corresponds to a first device. The transfer destination of the data strobe signal, i.e., the host or the memory chip, corresponds to a second device.

The data strobe signal, transferred from the host to the memory chip, is considered as a timing signal to be suppressed in jitter, by way of example. That is, the first device is the host and the second device is the memory chip.

FIG. 1 is a schematic diagram illustrating an exemplary configuration of a storage system SYS including a semiconductor storage device 1 according to an embodiment.

The storage system SYS includes a host HA and the semiconductor storage device 1. The semiconductor storage device 1 includes an external terminal group 10, a bridge chip BC, and a plurality of memory chips CP1-1 to CP1-4 and CP2-1 to CP2-4. The semiconductor storage device 1 can be a multi-chip package (MCP), that is, the memory chips CP1-1 to CP1-4 and the memory chips CP2-1 to CP2-4 are stacked on the top of one another. In the semiconductor storage device 1 being the MCP, the periphery of the bridge chip BC and the memory chips CP1-1 to CP1-4 and CP2-1 to CP2-4 may be sealed with a molding resin. FIG. 1 illustrates an example that the bridge chip BC is connected to the four memory chips CP1-1 to CP1-4 via a channel CH1 and connected to the four memory chips CP2-1 to CP2-4 via a channel CH2. In short, the semiconductor storage device 1 can be configured as a multi-memory chip module including a plurality of (herein, eight) memory chips CP1-1 to CP1-4 and CP2-1 to CP2-4. The memory chips CP1-1 to CP1-4 and CP2-1 to CP2-4 are, for example, nonvolatile memory chips such as NAND flash memories. The number of memory chips CP included in the semiconductor storage device 1 is not limited to eight. The number of channels that connect the bridge chip BC and the memory chips CP to each other is not limited to two.

Hereinafter, the memory chips CP1-1 to CP1-4 may be collectively referred to as a memory chip CP1. The memory chips CP2-1 to CP2-4 may be collectively referred to as a memory chip CP2. The memory chips CP1-1 to CP1-4 and CP2-1 to CP2-4 may be collectively referred to as a memory chip CP.

The host HA may be a device such as a controller, or may be a processor included in an electronic device such as a computer or a portable terminal to control the semiconductor storage device 1. The semiconductor storage device 1 can be connected to the host HA via a channel CH0 which is a wired communication channel. The semiconductor storage device 1 and the host HA are connected via the wired communication channel CH0 configured under a given standard. In the case of the memory chips CP1-1 to CP1-4 and CP2-1 to CP2-4 being NAND flash memories, the given standard can be, for example, the toggle DDR standard or the ONFi standard. For example, the channel CH0 functions as a toggle DDR interface.

The bridge chip BC is electrically connected to the external terminal group 10 electrically connectable to the host HA. The host HA and the external terminal group 10 are connected through the channel CH0. In addition, the bridge chip BC is electrically connected to a plurality of (herein, two) channels CH1 and CH2. The memory chips CP1-1 to CP1-4 and CP2-1 to CP2-4 are connected to the bridge chip BC via the channels CH1 and CH2. The memory chips CP1-1 to CP1-4 are connected to the channel CH1 configured under a given standard. The memory chips CP2-1 to CP2-4 are connected to the channel CH2 configured under a given standard. In the case of the memory chip CP being NAND flash memories, the given standard can be, for example, the toggle DDR standard or the ONFi standard. Hereinafter, it is assumed that each memory chip CP be a NAND flash memory, and the given standard be the toggle DDR standard.

The channel CH0 includes a signal line for transferring a bridge chip enable signal BRG_CEn, a signal line for transferring a chip enable signal CEn, a signal line for transferring a command latch signal CLE, a signal line for transferring an address latch signal ALE, a signal line for transferring a write enable signal WEn, signal lines for transferring a read enable signal RE/REn, signal lines for transferring a data strobe signal DQS/DQSn, signal lines for transferring a data signal DQ[7:0] having a given bit width (8 bits herein, as an example), and a signal line for transferring a ready/busy signal R/Bn. The letter "n" attached to the end of the signal signs represents that the signals operate by negative logic. Whether the signals operate by negative logic or positive logic can be freely designed.

The chip enable signal CEn serves to place the memory chip being an access target in an enable state. The data strobe signal DQS/DQSn indicates timing at which the data signal DQ[7:0] representing data is acquired. That is, the data strobe signal DQS/DQSn is a timing signal for data transfer. The data strobe signal DQS/DQSn serves as a differential signal including a data strobe signal DQS and a data strobe signal DQSn. The command latch enable signal CLE indicates that the data signal DQ[7:0] is a command. The address latch enable signal ALE indicates that the data signal DQ[7:0] is an address. The write enable signal WEn serves to provide an instruction for a transmission destination (counterpart device) to acquire the transmitted data signal DQ[7:0] representing a command or an address. The read enable signal RE/REn indicates output timing of the data signal DQ[7:0] by the memory chip CP. The read enable signal RE/REn serves as a differential signal including a read enable signal RE and a read enable signal REn. The ready/busy signal R/Bn indicates a ready state (Ry) or a busy state (By). In the ready state the memory chip CP waits for reception of a command. In the busy state the memory chip CP cannot execute a command upon receipt. Herein, the channel CH0 includes, as an example, a signal line for transferring a ready/busy signal R/Bn_1, i.e., a ready/busy signal R/Bn for the channel CH1, and a signal line for transferring a ready/busy signal R/Bn_2, i.e., a ready/busy signal R/Bn for the channel CH2. The signal line configuration of the channel CH0 for transferring the ready/busy signal R/Bn is not limited to the example described above. For example, the channel CH0 may include one signal line for transferring one ready/busy signal R/Bn generated by performing an OR operation on the ready/busy signal R/Bn for the channel CH1 and the ready/busy signal R/Bn for the channel CH2.

The bridge chip enable signal BRG_CEn is placed in an active state at a time of transmitting a control command for the bridge chip BC. When receiving a signal (that is, a command, an address, and data) during an active period of the bridge chip enable signal BRG_CEn, the bridge chip BC interprets the signal as a signal addressed to itself. Further, when receiving a signal from the host HA during the active period of the bridge chip enable signal BRG_CEn, the bridge chip BC refrains from transferring the signal to any of the memory chips CP. When receiving a signal from the host HA during an inactive period of the bridge chip enable signal BRG_CEn, the bridge chip BC transfers the signal to the memory chip CP to be accessed.

In the following, an operation mode of the bridge chip BC, in which the bridge chip BC interrupts the transfer of the signal from the host HA to the memory chip CP and interprets the signal in question as a signal addressed to itself, will be referred to as a bridge control mode. An operation mode of the bridge chip BC, in which the bridge chip BC transfers a signal from the host HA to the memory chip CP, will be referred to as a non-bridge control mode. That is, the bridge chip enable signal BRG_CEn also serves to switch the operation mode of the bridge chip BC between the non-bridge control mode and the bridge control mode.

Each of the channels CH1 and CH2 includes a signal group having the same configuration as that of the channel CH0, except for the signal line for transferring the bridge chip enable signal BRG_CEn and a signal line group for transferring the data signal DQ[7:0]. Specifically, each of the channels CH1 and CH2 includes a signal line for transferring the chip enable signal CEn, a signal line for transferring the command latch signal CLE, a signal line for transferring the address latch signal ALE, a signal line for transferring the write enable signal WEn, signal lines for transferring the read enable signal RE/REn, a signal line group for transferring a data signal DQ[15:0], signal lines for transferring the data strobe signal DQS/DQSn, and a signal line for transferring the ready/busy signal R/Bn.

That is, the channels CH1 and CH2 both include no signal line for transferring the bridge chip enable signal BRG_CEn. Further, the signal line group, of each of the channels CH1 and CH2, for transferring the data signal DQ[15:0] is twice wider in bit width than the signal line group, of the channel CH0, for transferring the data signal DQ[7:0]. Thus, even if data is transferred via the channels CH1 and CH2 at a half frequency as that via the channel CH0, the data transfer rate through the channel CH0 can be equal to the data transfer rate through each of the channels CH1 and CH2.

A ratio of the frequencies of the data transfer via the channel CH0 and via each of the channels CH1 and CH2 is not limited to 2:1. For example, the frequency of the data transfer via the channel CH0 may be the same as the frequency of the data transfer via each of the channels CH1 and CH2. At the same data transfer frequency via the channel CH0 and via each of the channels CH1 and CH2, the data signals DQ to be transferred via the channels CH1 and CH2 can be set to the same bit width as the data signal DQ[7:0] to be transferred via the channel CH0.

The following will omit a description of the data strobe signal DQSn between the data strobe signals DQS/DQSn and describe the data strobe signal DQS alone for the sake of simpler explanation.

The bridge chip BC includes a first interface 101, two second interfaces 102 (102-1 and 102-2), a controller 103, and a buffer memory 104.

The first interface 101 serves as a PHY circuit that transmits and receives an electric signal to and from the host HA via the channel CH0. The first interface 101 is an exemplary first interface circuit that receives the data strobe signal DQS from the host HA being the first device.

The second interface 102-1 of the two second interfaces 102 is a PHY circuit that transmits and receives electric signals to and from the four memory chips CP1-1 to CP1-4 via the channel CH1. The second interface 102-2 of the two second interfaces 102 is a PHY circuit that transmits and receives electric signals to and from the four memory chips CP2-1 to CP2-4 via the channel CH2. Each of the second interfaces 102 is an exemplary second interface circuit that transmits the data strobe signal DQS to the memory chip CP being the second device.

The buffer memory 104 is capable of temporarily storing data to be transferred between the host HA and the memory chip CP. The buffer memory 104 may include, but be not limited to, a dynamic random access memory (DRAM) or a static random access memory (SRAM).

The controller 103 is disposed between the first interface 101 and the two second interfaces 102. The controller 103 controls exchange of information between the first interface 101 and the two second interfaces 102 using the buffer memory 104. The information can be a command, an address, or data.

The controller 103 includes a command decoder 111, a signal transfer circuit 112, a mask circuit 113, and a register 114.

The command decoder 111 serves to analyze a command received from the host HA via the channel CH0. The command decoder 111 can issue a command to the memory chip CP according to a result of the analysis. The command issued from the command decoder 111 to the memory chip CP may be the same or may be related to but not completely the same as the command received from the host HA. That is, the command decoder 111 can issue a command corresponding to the command received from the host HA via the channel CH0.

The signal transfer circuit 112 is located in a data path connecting the first interface 101 and the second interface 102. The signal transfer circuit 112 transmits, to the second interfaces 102-1 and 102-2, the data strobe signal DQS and the data signal DQ representing write data received from the channel CH0 via the first interface 101. The signal transfer circuit 112 supplies the data signal DQ and the data strobe signal DQS to one of the channels CH1 and CH2 via one of the second interfaces 102-1 and 102-2.

Hereinafter, the data signal DQ[7:0] received from the channel CH0 via the first interface 101 may be referred to as a data signal H_DQ[7:0] or a data signal H_DQ. The data strobe signal DQS received from the channel CH0 via the first interface 101 may be referred to as a data strobe signal H_DQS. The data signal DQ[15:0] transmitted to the channels CH1 and CH2 via the second interfaces 102-1 and 102-2 may be referred to as a data signal N_DQ[15:0] or a data signal N_DQ. The data strobe signal DQS supplied to the channels CH1 and CH2 via the second interfaces 102-1 and 102-2 may be referred to as a data strobe signal N_DQS.

The mask circuit 113 is capable of interrupting a signal supply to the memory chip CP in accordance with the bridge chip enable signal BRG_CEn. In the bridge control mode, i.e., the operation mode during the active period of the bridge chip enable signal BRG_CEn, the mask circuit 113 interrupts a signal supply to the memory chip CP. In the non-bridge control mode, i.e., the operation mode during the inactive period of the bridge chip enable signal BRG_CEn, the mask circuit 113 passes a signal to the memory chip CP. That is, the mask circuit 113 implements switching between the bridge control mode and the non-bridge control mode depending on the bridge chip enable signal BRG_CEn.

The register 114 serves as a memory into which various types of control information (referred to as operation control information) as to the operation of the bridge chip BC are written. The operation control information is not limited to specific information. For example, the operation control information may be setting information to be used in controlling the bridge chip BC. The setting information is transmitted from the host HA to the bridge chip BC and stored therein. The controller 103 performs an operation according to the setting information. The setting information includes, for example, size information 115 as numerical information representing the size of transfer data. A use method of the size information 115 will be described later.

The bridge chip BC allows the size information 115 to be written to the register 114 in the bridge control mode, for example, in accordance with a register write command from the host HA. As a result, the command for writing the size information 115 to the register 114 does not reach any memory chip CP.

In the bridge control mode, the bridge chip BC transfers no commands to the channels CH1 and CH2 upon receipt from the host HA. Thus, the operation command for the bridge chip BC in the bridge control mode can be freely defined. For example, the operation command for the bridge chip BC in the bridge control mode may be the command defined by the toggle DDR standard or a command defined not by a specific standard. As an example of using the command defined by the toggle DDR standard, a set feature command can be set to the command for writing the size information 115 to the register 114. The command for writing the size information 115 to the register 114 is not limited to such an example.

Figure 2:
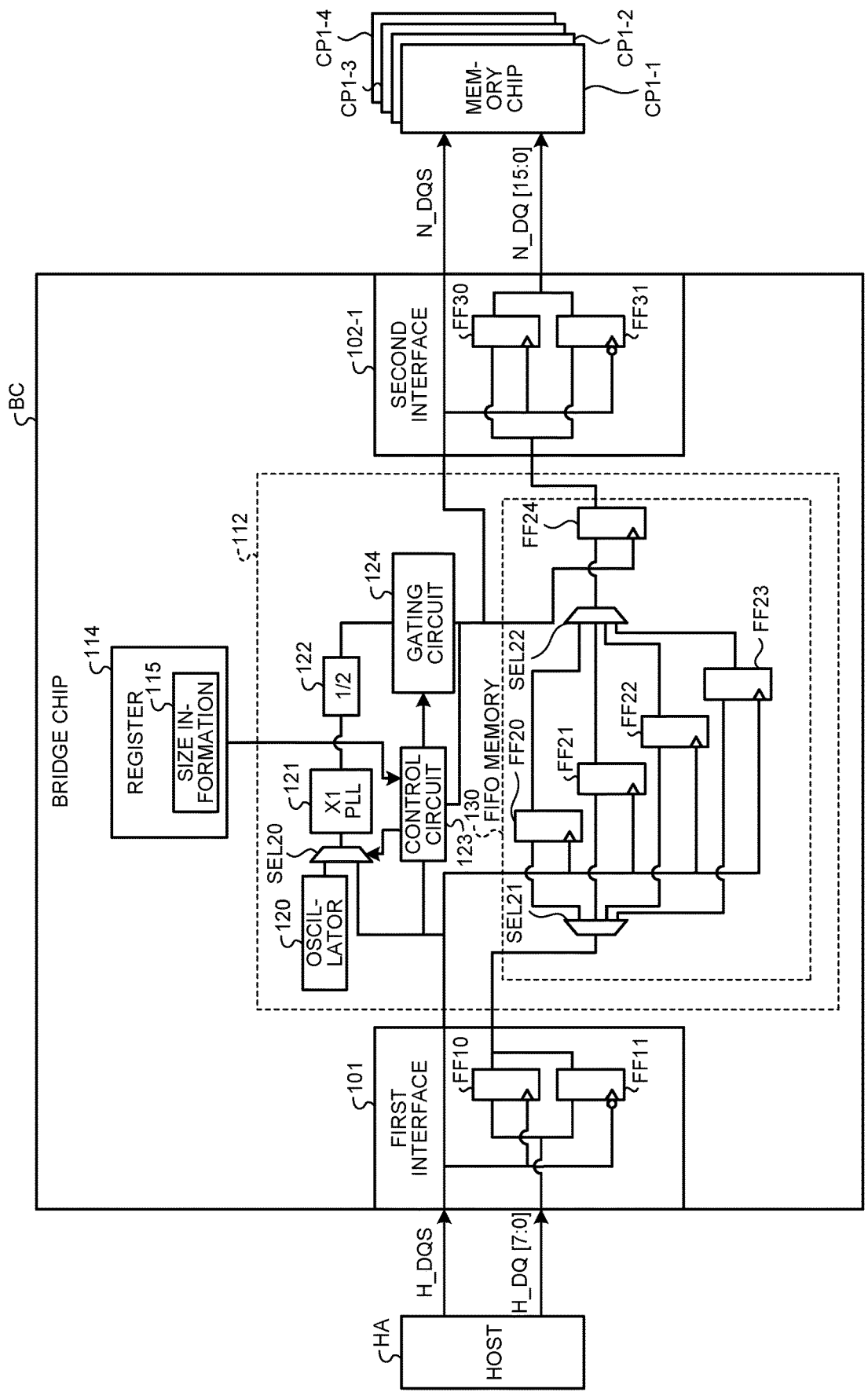
FIG. 2 is a schematic diagram illustrating a detailed configuration of a bridge chip according to an embodiment.

FIG. 2 is a schematic diagram illustrating a detailed configuration of the bridge chip BC according to an embodiment. FIG. 2 omits illustrating the second interface 102-2 and the memory chips CP2-1 to CP2-4 for the sake of simplicity. The signal transfer circuit 112 may be provided for each second interface 102. Alternatively, the second interface 102-1 and the second interface 102-2 may share one signal transfer circuit 112. The bridge chip BC may include, at an output side, a selector that switches a destination of an output signal of the signal transfer circuit 112 between the second interface 102-1 and the second interface 102-2.

The first interface 101 includes two D-flip-flops FF10 and FF11. The data signal H_DQ[7:0] is input to a D-input terminal of each of the D-flip-flops FF10 and FF11. The data strobe signal H_DQS is input to a clock input terminal of the D-flip-flop FF10. A signal obtained by inverting the data strobe signal H_DQS by a NOT circuit is input to a clock input terminal of the D-flip-flop FF11. As configured above, the first interface 101 changes a transfer method of the data signal H_DQ[7:0] from double-data-rate (DDR) to single-data-rate (SDR). The first interface 101 receives a data signal H_DQ[7:0] at a rising timing of the data strobe signal H_DQS and a data signal H_DQ[7:0] at a falling timing of the data strobe signal H_DQS, and outputs a 16-bit data signal to be transferred at the rising timing of the data strobe signal H_DQS in accordance with both the data signals H_DQ[7:0].

A transmitter/receiver 112 of the bridge chip BC includes an oscillator 120, a selector SEL20, a PLL circuit (PLL) 121, a frequency divider 122, a control circuit 123, a gating circuit 124, and a first-in first-out (FIFO) memory 130. The FIFO memory 130 includes selectors SEL21 and SEL22, a plurality of D-flip-flops (herein, four D-flip-flops FF20 to FF23 as an example), and a D-flip-flop FF24.

The oscillator 120 is an oscillation circuit that generates a clock signal with a given frequency. The oscillator 120 can be any type of oscillation circuit. Examples of the oscillator 120 include, but are not limited to, a crystal oscillation circuit and an RC oscillation circuit. A clock generated by the oscillator 120 is referred to as an oscillator clock.

The selector SEL20 includes two input terminals. The data strobe signal H_DQS is input to one of the two input terminals of the selector SEL20. The oscillator clock is input to the other of the two input terminals of the selector SEL20. An output terminal of the selector SEL20 is connected to an input terminal of the PLL 121. That is, the selector SEL20 switches a reference clock of the PLL 121 between the data strobe signal H_DQS and the oscillator clock. A control terminal of the selector SEL20 is controlled by the control circuit 123.

The PLL 121 generates a clock in synchronization with the reference clock in phase. Herein, the PLL 121 generates a clock at the same frequency as the reference clock, as an example. The clock generated by the PLL 121 is referred to as a PLL clock.

The frequency divider 122 divides the frequency of the PLL clock in half to generate a clock with a half frequency as that of the PLL clock. The clock generated by the frequency divider 122 is referred to as a frequency-divider clock.

The gating circuit 124 can supply the frequency-divider clock to the subsequent circuit or interrupt the supply of the frequency-divider clock thereto.

The frequency-divider clock through the gating circuit 124 is output as the data strobe signal N_DQS. The gating circuit 124 is controlled by the control circuit 123. That is, the control circuit 123 can interrupt the data strobe signal N_DQS or cancel the interruption of the data strobe signal N_DQS by controlling the gating circuit 124.

The selector SEL21 receives at an input terminal a 16-bit data signal DQ, which is a converted signal of the data signal H_DQ[7:0] by the first interface 101. The selector SEL21 includes a plurality of output terminals. In FIG. 2, the selector SEL21 is represented as a selector SEL including four output terminals.

The D-flip-flops FF20 to FF23 can each acquire 16-bit data. That is, each of the D-flip-flops FF20 to FF23 is a group of 16 D-flip-flops. D-input terminals of the D-flip-flops FF20 to FF23 are connected to different output terminals of the selector SEL21, respectively. The data strobe signal H_DQS is input to respective clock input terminals of the D-flip-flops FF20 to FF23.

Q-output terminals of the D-flip-flops FF20 to FF23 are connected to different input terminals of the selector SEL22, respectively. An output terminal of the selector SEL22 is connected to a D-input terminal of the D-flip-flop FF24. The D-flip-flop FF24 receives, at a clock input terminal, the data strobe signal N_DQS, that is, the frequency-divider clock having passed through the gating circuit 124.

Thus, the selectors SEL21 and SEL22, the D-flip-flops FF20 to FF23, and the D-flip-flop FF24 function as the FIFO memory 130 in cooperation with one another. The FIFO memory 130 stores 16-bit data in synchronization with the data strobe signal H_DQS, specifically, at the rising timing of the data strobe signal H_DQS. The storage location in the D-flip-flops FF20 to FF23 is selected in a round-robin manner. The FIFO memory 130 combines two sets of 16-bit data into a set of 32-bit data and transfers the 32-bit data to the second interface 102-1 in synchronization with the data strobe signal N_DQS, specifically, at a rising timing of the data strobe signal N_DQS. The D-flip-flop to be a data output source is selected from among the D-flip-flops FF20 to FF23 according to the FIFO rule. Thus, two sets of data to be output from the FIFO memory 130 are selected in the order that the two sets are stored in the FIFO memory 130.

The selectors SEL21 and SEL22 can be controlled by any circuitry. As one example, the selectors SEL21 and SEL22 are controlled by the control circuit 123.

The configuration of the FIFO memory 130 is not limited to the example above. For example, a size of data stored in each of the D-flip-flops FF20 to FF23 of the FIFO memory 130 is not limited to 16 bits. The FIFO memory 130 may include another type of memory such as an SRAM.

In FIG. 2, the FIFO memory 130 is represented as a FIFO memory that can store four pieces of 16-bit data at maximum for the sake of simplicity. A capacity of the FIFO memory 130 is not limited thereto. A required capacity of the FIFO memory 130 will be described later.

The control circuit 123 can detect a start of input of the data strobe signal H_DQS and count the number of toggles of each of the data strobe signal H_DQS and the data strobe signal N_DQS. In addition, the control circuit 123 can read the size information 115 from the register 114.

After detecting the start of input of the data strobe signal H_DQS, the control circuit 123 controls the selector SEL20 to select the data strobe signal H_DQS as the reference clock to be input to the PLL 121. In response to the input start of the data strobe signal H_DQS, the control circuit 123 starts counting the number of toggles of the data strobe signal H_DQS.

The control circuit 123 then determines completion or incompletion of the input of the data strobe signal H_DQS based on the count of the number of toggles of the data strobe signal H_DQS. After determining completion of the input of the data strobe signal H_DQS, the control circuit 123 controls the selector SEL20 to select the oscillator clock as the reference clock to be input to the PLL 121.

The register 114 stores the size information 115 before the data strobe signal H_DQS is input. The size information 115 represents the size of data to be transferred later. That is, the size information 115 corresponds to the expected number of toggles of the data strobe signal H_DQS. The control circuit 123 determines completion or incompletion of the input of the data strobe signal H_DQS depending on whether or not the count of the number of toggles of the data strobe signal H_DQS matches the expected number of toggles. Specifically, with the count of the number of toggles of the data strobe signal H_DQS not matching the expected number of toggles, the control circuit 123 determines incompletion of the input of the data strobe signal H_DQS. With the count value of the number of toggles of the data strobe signal H_DQS matching the expected number of toggles, the control circuit 123 determines completion of the input of the data strobe signal H_DQS.

Immediately after switching of the reference clock, the PLL clock is not in synchronization with the switched reference clock that has been switched in phase (that is, not in a locked state). The state of the PLL clock not in synchronization with the reference clock in phase is referred to as an unlocked state. It takes a certain time for the PLL 121 to enter the locked state after the reference clock is switched. During the unlocked state of the PLL 121 after the reference clock is switched, the control circuit 123 interrupts the data strobe signal N_DQS by controlling the gating circuit 124. After the PLL 121 enters the locked state, the control circuit 123 cancels the interruption of the data strobe signal N_DQS.

Whether or not the PLL 121 is in the locked state can be determined by any method.

As one example, the control circuit 123 determines whether or not the PLL 121 is in the locked state from a time elapsed from the switching of the reference clock. The time taken for the PLL 121 to enter the locked state from the unlocked state depends on a performance of the PLL 121. After switching the reference clock, the control circuit 123 measures the elapsed time to determine whether or not the elapsed time matches the time taken for the PLL 121 to enter the locked state. The elapsed time can be measured with reference to the count of the PLL clock or any clock different from the PLL clock. It is inferred that the PLL 121 is still in the unlocked state, from the elapsed time not matching the time taken for the PLL 121 to enter the locked state. Consequently, the control circuit 123 continues to interrupt the data strobe signal N_DQS. It is inferred that the PLL 121 is now placed in the unlocked state, from the elapsed time matching the time taken for the PLL 121 to enter the locked state. In this case the control circuit 123 cancels the interruption of the data strobe signal N_DQS.

For another example, whether or not the PLL 121 is in the locked state can be determined by monitoring a signal representing a phase difference between a feedback signal of the PLL 121 and the reference clock. From the difference signal being higher in level than a given level, it is inferred that the PLL 121 is still in the unlocked state. Consequently, the control circuit 123 continues to interrupt the data strobe signal N_DQS. It is inferred from the difference signal being lower in level than a given level that the PLL 121 is now in the locked state. In this case the control circuit 123 cancels the interruption of the data strobe signal N_DQS.

The second interface 102 includes two D-flip-flops FF30 and FF31. The D-flip-flop FF30 receives, at a D-input terminal, 16-bit data among 32-bit data output from the FIFO memory 130, that is, one set of 16-bit data input to the FIFO memory 130 at earlier timing. The D-flip-flop FF31 receives, at a D-input terminal, the other set of 16-bit data output from the FIFO memory 130, that is, data input to the FIFO memory 130 at later timing. The data strobe signal N_DQS is input to a clock input terminal of the D-flip-flop FF30. A signal obtained by inverting the data strobe signal N_DQS by a NOT circuit is input to a clock input terminal of the D-flip-flop FF31. As configured above, the second interface 102 can generate the data signal N_DQ[15:0] to be transferred by the DDR, from the 32-bit data output from the FIFO memory 130. The second interface 102 outputs the generated data signal N_DQ[15:0] together with the data strobe signal N_DQS to the memory chip CP1 being a transmission destination.

Herein, the ratio of the frequencies of the data transfer via the channel CH0 and via each of the channels CH1 and CH2 is set to 2:1. Thus, while the data strobe signal H_DQS is being input, the frequency divider 122 divides the frequency of the PLL clock generated according to the data strobe signal H_DQS in half, to generate the data strobe signal N_DQS with a frequency half the frequency of the data strobe signal H_DQS. The designer can set a frequency division ratio of the frequency divider 122 according to the setting of the ratio of the frequencies of the data transfer via the channel CH0 and via the channels CH1 and CH2. The channel CH0 and the channels CH1 and CH2 may have the same data transfer frequency. In such a case the frequency divider 122 can be omitted. In some cases, the data strobe signal N_DQS may be generated by subjecting the PLL clock to other processing (for example, multiplication) than the frequency division.

The designer can freely decide which one of the PLL clock and a clock generated by frequency division or multiplication of the PLL clock is used as the data strobe signal N_DQS. The PLL 121 of the bridge chip BC generates the PLL clock, and the bridge chip PC generates a clock (that is, the PLL clock or the clock generated by frequency division or multiplication of the PLL clock) corresponding to the generated PLL clock to transmit the clock as the data strobe signal N_DQS to the memory chip CP.

Owing to the above-described configuration, the bridge chip BC can transmit the data strobe signal N_DQS with no jitter (or containing negligible jitter) to the memory chip CP. Thereby, the memory chip CP can receive a data strobe signal with less jitter, as compared with receiving the data strobe signal H_DQS from the bridge chip BC as it is.

As described above, the host HA transmits the data signal H_DQ[7:0] representing a command, an address, or data. The signal transfer circuit 112 receives the command, the address, and the data of the data signals H_DQ[7:0] and transfers the data. Among the command, the address, and the data of the data signals H_DQ[7:0], the command and the address are transferred through a path (not illustrated) different from the signal transfer circuit 112. The controller 103 includes a selector (not illustrated) that selects the data from among the command, the address, and the data of the data signals H_DQ[7:0]transmitted from the host HA and inputs the data to the signal transfer circuit 112. The selector can select the data from among the command, the address, and the data of the data signals H_DQ[7:0] according to, for example, the command latch enable signal CLE and the address latch enable signal ALE.

Next, the operation of the semiconductor storage device 1 according to an embodiment will be described.

As described above, the size information 115 is written to the register 114 of the bridge chip BC in the bridge control mode. First, differences in operation between the bridge control mode and the non-bridge control mode will be described.

Figure 3:
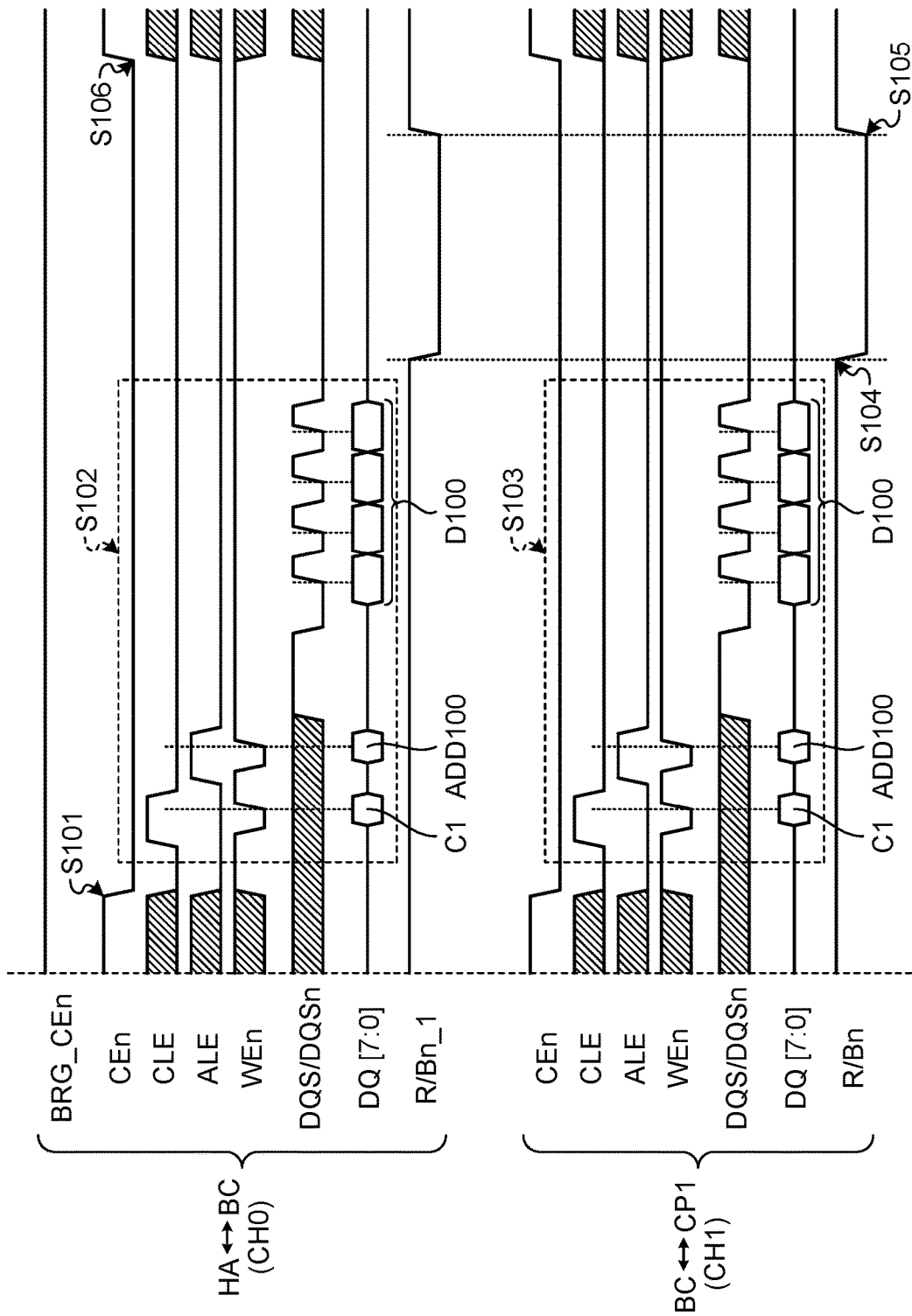
FIG. 3 is a timing chart for explaining an exemplary operation of the semiconductor storage device in a non-bridge control mode according to an embodiment.

FIG. 3 is a timing chart for explaining an exemplary operation of the semiconductor storage device 1 in the non-bridge control mode according to an embodiment. The bridge chip BC is set in the non-bridge control mode when the host HA transmits, to the bridge chip BC, a command addressed to the memory chip CP. The following will describe an example that the host HA transmits a set feature command addressed to a certain memory chip CP1 connected to the channel CH1.

In transmitting a command addressed to the memory chip CP1 (in other words, not addressed to the bridge chip BC), the host HA maintains the bridge chip enable signal BRG_CEn in the inactive state (H-level). FIG. 3 illustrates an example that the host HA maintains the inactive state (H-level) of the bridge chip enable signal BRG_CEn.

The host HA then causes the chip enable signal CE of the channel CH0 to transition to the active state (L-level) (S101). In response to this transition, the chip enable signal CE of the channel CH1 also transitions to the active state (L-level).

The host HA transmits the set feature command (S102). Specifically, the host HA transmits, as the data signals H_DQ[7:0], a command value C1 representing the set feature command, an address value ADD100 indicating a location of an access destination, and data D100 to be written in this order. In transmitting the command value C1, the host HA maintains the command latch enable signal CLE in the active state (H-level) and toggles the write enable signal WEn. In transmitting the address value ADD100, the host HA maintains the address latch enable signal ALE in the active state (H-level) and toggles the write enable signal WEn. In transmitting the data D100, the host HA toggles the data strobe signal H_DQS.

Since the bridge chip enable signal BRG_CEn is maintained in the inactive state (H-level), the mask circuit 113 of the bridge chip BC transfers the signal from the host HA to the memory chip group CP. Thus, the bridge chip BC transfers the set feature command supplied from the host HA in S102 to the channel CH1 as it is (S103). Meanwhile, a slight delay may occur in reception and transmission timing at which the bridge chip BC receives the set feature command from the host HA and transmits that to the memory chip group CP.

The memory chip CP1 as a transmission destination receives the set feature command including the command value C1, the address value ADD100, and the data D100 via the channel CH1. The memory chip CP1 as the transmission destination performs processing according to the received set feature command. That is, the memory chip CP1 as the transmission destination writes the received data D100 to a feature register of its own at the location indicated by the address value ADD100. At a time of starting the processing according to the set feature command, the memory chip CP1 as the transmission destination causes the ready/busy signal R/Bn of the channel CH1 to transition to a busy state (L-level) (S104). After completion of the processing according to the set feature command, the memory chip CP1 as the transmission destination causes the ready/busy signal R/Bn of the channel CH1 to return to a ready state (S105). The ready/busy signal R/Bn of the channel CH1 is transferred through the bridge chip BC and received by the host HA as the ready/busy signal R/Bn_1 of the channel CH0 with a slight delay or without delay.

The host HA recognizes completion of the execution of the set feature command from the return of the ready/busy signal R/Bn_1 to the ready state from the busy state, and causes the chip enable signal CE of the channel CH0 to transition to the inactive state (H-level) (S106). In response to the transition, the chip enable signal CE of the channel CH1 also transitions to the inactive state (H-level).

As described above, in transmitting a command to any of the memory chips CP, the host HA maintains the bridge chip enable signal BRG_CEn in the inactive state. During the inactive state of the bridge chip enable signal BRG_CEn, the bridge chip BC transfers the command from the host HA to the channels CH1 and CH2. Thus, the memory chip CP as a transmission destination can receive the command addressed to itself.

Figure 4:
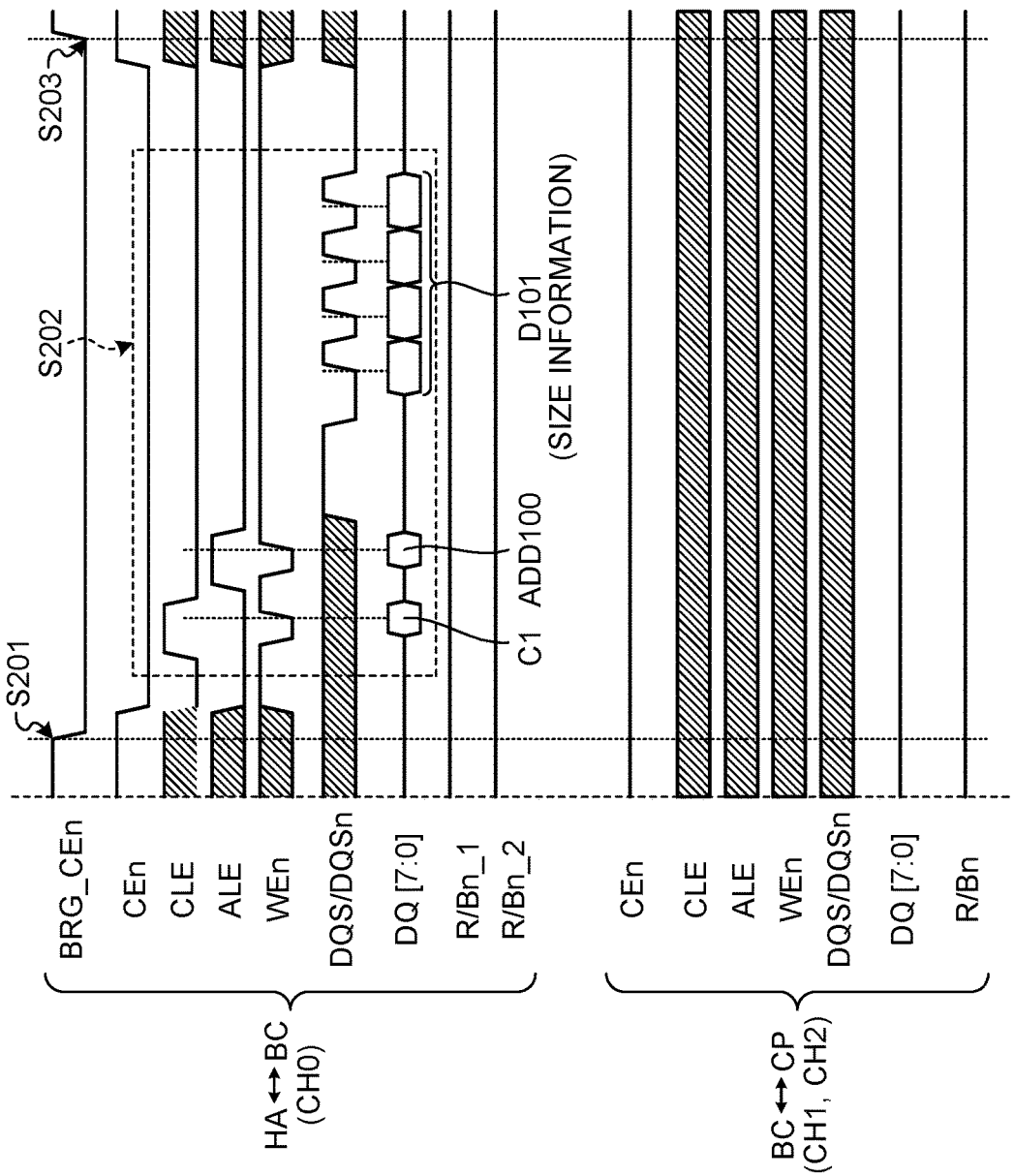
FIG. 4 is a timing chart for explaining an exemplary operation of the semiconductor storage device in a bridge control mode according to an embodiment.

FIG. 4 is a timing chart for explaining an exemplary operation of the semiconductor storage device 1 in the bridge control mode according to an embodiment. The bridge chip BC is set to the bridge control mode when the host HA transmits a command addressed to the bridge chip BC. The following will describe an example that the host HA transmits a set feature command for writing the size information 115 to the register 114 as an example of the command addressed to the bridge chip BC.

First, the host HA causes the bridge chip enable signal BRG_CEn to transition to the active state (L-level) (S201). As a result, the operation mode of the bridge chip BC transitions from the non-bridge control mode to the bridge control mode.

Subsequently, the host HA transmits the set feature command (S202). In the example of FIG. 4, the host HA causes the chip enable signal CEn to transition to the active state (L-level) before transmitting the set feature command. The host HA may not control the chip enable signal CEn.

The set feature command is transmitted in the same procedure as the command addressed to the memory chip CP illustrated in FIG. 3. Specifically, the host HA transmits, as the data signals H_DQ[7:0], a command value C1 representing the set feature command, an address value ADD101 indicating a location of an access destination, and data D101 to be written in this order. In transmitting the command value C1, the host HA maintains the command latch enable signal CLE in the active state (H-level) and toggles the write enable signal WEn. In transmitting the address value ADD101, the host HA maintains the address latch enable signal ALE in the active state (H-level) and toggles the write enable signal WEn. In transmitting the data D101, the host HA toggles the data strobe signal H_DQS.

In the case of writing the size information 115 to the register 114 by the set feature command, the data D101 to be written is the size information 115.

In the bridge control mode, the mask circuit 113 of the bridge chip BC interrupts the signal supply from the host HA to the memory chip CP. In addition, in the bridge control mode the command decoder 111 of the bridge chip BC interprets the command value C1, the address value ADD101, and the data D101 as the set feature command addressed to itself. The controller 103 executes the set feature command supplied in S202. That is, the controller 103 writes the received size information 115 being the data D101 to the register 114 of its own at the location indicated by the address value ADD101.

After completion of the transmission of the set feature command, the host HA causes the bridge chip enable signal BRG_CEn to transition to the inactive state (H-level) (S203). As a result, the operation mode of the bridge chip BC transitions from the bridge control mode to the non-bridge control mode.

As described above, in transmitting a command addressed to the bridge chip BC, the host HA maintains the bridge chip enable signal BRG_CEn in the active state. During the active state of the bridge chip enable signal BRG_CEn, the bridge chip BC refrains from transferring the command from the host HA to the channels CH1 and CH2. Thereby, none of the memory chips CP can receive the command addressed to the bridge chip BC.

Upon receipt of the set feature command addressed to the bridge chip BC, a certain memory chip CP may perform processing as defined by the standard irrespective of the destination of the command. In other words, the certain memory chip CP may malfunction. While executing the processing by the standard, the certain memory chip CP maintains the ready/busy signal R/Bn in the busy state irrespective of the fact that the processing is a malfunction, and transmits the ready/busy signal R/Bn to the host HA via the channel CH0. The host HA cannot transmit the next command via the channel CH0 during the busy-state period of the ready/busy signal R/Bn in the channel CH0.

The host HA can prevent the command addressed to the bridge chip BC from reaching the memory chip CP by using the bridge chip enable signal BRG_CEn. This makes it possible to prevent the memory chip CP from malfunctioning due to the command addressed to the bridge chip BC. In other words, the time for the host HA to wait for completion of the malfunction does not occur. Thus, as illustrated in FIG. 4, the memory chip CP is prevented from causing the ready/busy signal R/Bn to transition to the busy state, responding to the command addressed to the bridge chip BC. Thereby, the memory chip CP maintains the ready/busy signal R/Bn in the ready state, not affected by the command addressed to the bridge chip BC. The ready/busy signal R/Bn is transferred from the memory chip CP and received by the host HA as the ready/busy signal R/Bn_1. That is, the ready/busy signal R/Bn_1 to be input to the host HA is maintained in the ready state regardless of the command addressed to the bridge chip BC. This enables the host HA to promptly transmit the next command to the memory chip CP after transmitting the command addressed to the bridge chip BC, resulting in improving the data transfer rate between the host HA and the memory chips CP.

The signal serving to switch the operation mode of the bridge chip BC between the non-bridge control mode and the bridge control mode is not limited to the bridge chip enable signal BRG_CEn.

In the data communication standard between the host HA and the semiconductor storage device 1, for example, all the command values are not assigned to actual operations. Undefined command values are referred to as vendor-specific commands and the vendor can freely assign them to intended controls. Such a command value can be used as a specific signal for mode switching. By using a vendor-specific command value as a specific mode switching signal, it is possible to omit the signal line for transferring the bridge chip enable signal BRG_CEn from the channel CH0. The controller 103 is equipped with a signal line for an internal bridge chip enable signal IBRG_CEn, in place of the signal line for transferring the bridge chip enable signal BRG_CEn. The internal bridge chip enable signal IBRG_CEn acts on the mask circuit 113 as with the bridge chip enable signal BRG_CEn. For example, the internal bridge chip enable signal IBRG_CEn is stored in the register 114. The internal bridge chip enable signal IBRG_CEn is input to the mask circuit 113 through the signal line. During the active period (L-level) of the internal bridge chip enable signal IBRG_CEn, the mask circuit 113 interrupts the signal supply to the memory chip CP. During the inactive (H-level) period of the internal bridge chip enable signal IBRG_CEn, the mask circuit 113 transfers the signal to the memory chip CP. During the active period (L-level) of the internal bridge chip enable signal IBRG_CEn, the bridge chip BC operates in the bridge control mode.

After interpreting the command received from the host HA as a bridge control command, the command decoder 111 causes the internal bridge chip enable signal IBRG_CEn to transition to the active state (L-level). In response to a transition of the chip enable signal CEn of the channel CH0 from the active state (L-level) to the inactive state (H-level) during the active period (L-level) of the internal bridge chip enable signal IBRG_CEn, the controller 103 causes the internal bridge chip enable signal IBRG_CEn to transition from the active state (L-level) to the inactive state (H-level).

FIG. 5 is a timing chart for explaining another exemplary operation of the semiconductor storage device 1 in the bridge control mode according to an embodiment. As with the example illustrated in FIG. 4, the host HA transmits the set feature command for writing the size information 115 to the register 114, as an example of the command addressed to the bridge chip BC.

In the example illustrated in FIG. 5, the host HA causes the chip enable signal CEn to transition to the active state (L-level) regardless of the transmission destination, that is, the bridge chip BC or the memory chip CP (S301).

The host HA transmits a bridge control command to the bridge chip BC in order to cause the operation mode of the bridge chip BC to transition to the bridge control mode (S302). In S302, the host HA transmits the data signal H_DQ[7:0] representing a command value C2 indicating the bridge control command. In transmitting the command value C2, the host HA maintains the command latch enable signal CLE in the active state (H-level) and toggles the write enable signal WEn.

Upon receiving the command value C2, the command decoder 111 of the bridge chip BC interprets the command value C2 as the bridge control command. The controller 103 then causes the internal bridge chip enable signal IBRG_CEn to transition to the active state (L-level) (S304). In response to the transition of the internal bridge chip enable signal IBRG_CEn to the active state (L-level), the mask circuit 113 starts interrupting the signal supply from the host HA to the memory chip CP. As a result, the bridge chip BC transitions from the non-bridge control mode to the bridge control mode.

The internal bridge chip enable signal IBRG_CEn is in the inactive state (H-level) before the bridge chip BC transitions to the bridge control mode. Thus, the bridge chip BC transfers the bridge control command from the host HA to the memory chip CP via the channels CH1 and CH2 (S303), and the memory chip CP receives the bridge control command. The command value C2 is, however, a value selected from undefined as vendor-specific command values for the memory chip CP, therefore, the memory chip CP cannot interpret the command value C2. Because of this, in spite of receipt of the command value C2, the memory chip CP does not start any processing.

In response to the transition of the bridge chip BC to the bridge control mode, the host HA transmits the set feature command, as with the operation illustrated in FIG. 4 (S305). Specifically, the host HA transmits, as the data signals H_DQ[7:0], a command value C1 representing the set feature command, an address value ADD103 indicating a location of an access destination, and data D103 to be written in this order. The data D 103 to be written is, for example, the size information 115.

In the bridge control mode, the controller 103 of the bridge chip BC interprets the command (in this case, the set feature command) supplied from the host HA as a command addressed to itself. The command decoder 111 interprets the received command as the set feature command. The controller 103 then performs processing according to the set feature command. That is, the controller 103 writes the data D103 as the size information 115 to the register 114 of its own at the location indicated by the address value ADD103.

In addition, in the bridge control mode the memory chip CP does not receive the set feature command transmitted by the host HA. Thus, the memory chip CP is prevented from performing the operation according to the set feature command addressed to the bridge chip BC.

After completion of transmitting the set feature command, the host HA causes the chip enable signal CE to transition to the inactive state (H-level) (S306). The controller 103 of the bridge chip BC then causes the internal bridge chip enable signal IBRG_CEn to transition to the inactive state (H-level) (S307). As a result, the bridge chip BC transitions from the bridge control mode to the non-bridge control mode. After completion of the bridge control mode, the bridge chip BC can transfer a command from the host HA to the memory chip CP.

Although the semiconductor storage device 1 uses one of the vendor-specific command values as the specific mode switching signal, the semiconductor storage device 1 operates in the non-bridge control mode in the same manner as in FIG. 3.

As described above, the specific command, i.e., the bridge control command can be used to switch the operation mode of the bridge chip BC. By assigning one of the vendor-specific command values to the bridge control command, the operation mode of the bridge chip BC can be switched.

FIG. 6 is a flowchart illustrating an exemplary operation of the control circuit 123 according to an embodiment.

Under the toggle DDR standard, the host HA changes the level of the data strobe signal H_DQS from the H-level to the L-level once immediately before starting inputting the data signal H_DQ[7:0]. That is, the transition of the data strobe signal H_DQS from the H-level to the L-level with no input of the data signal H_DQ[7:0] signifies that the input of the data signal H_DQ[7:0] and the toggling of the data strobe signal H_DQS will start shortly. The control circuit 123 monitors the level of the data strobe signal H_DQS to determine whether or not the data strobe signal H_DQS has transitioned from the H-level to the L-level (S401).

After determining that the level of the data strobe signal H_DQS has not transitioned from the H-level to the L-level (NO in S401), the control circuit 123 performs the processing of S401 again.

After determining the transition of the data strobe signal H_DQS from the H-level to the L-level (YES in S401), the control circuit 123 controls the selector SEL20 to start supplying the data strobe signal H_DQS to the PLL 121, and controls the gating circuit 124 to start interrupting the data strobe signal N_DQS (S402). Until start of the processing of S402, for example, the PLL 121 receives the oscillator clock as the reference clock.

Subsequently, in response to start of toggling of the data strobe signal H_DQS, the control circuit 123 starts counting the number of toggles of the data strobe signal H_DQS (S403).

Concurrently with toggling the data strobe signal H_DQS, the host HA starts inputting the data signal H_DQ[7:0]. The first interface 101 receives and converts the data signal H_DQ[7:0] into a 16-bit data signal to be transferred by the SDR. The signal transfer circuit 112 sequentially stores the converted data signals into the FIFO memory 130.

By the switch of the reference clock from the oscillator clock to the data strobe signal H_DQS, the PLL 121 transitions from the locked state to the unlocked state. After a while, the PLL 121 enters the locked state again. The control circuit 123 determines whether or not the PLL 121 is in the locked state (S404).

As described above, the determination on the locked state of the PLL 121 can be made by any method. After determining that the PLL 121 is not in the locked state (NO in S404), the control circuit 123 performs the processing of S404 again.

After determining the locked state of the PLL 121 (YES in S404), the control circuit 123 controls the gating circuit 124 to cancel the interruption of the data strobe signal N_DQS (S405). As a result, the frequency-divider clock is output as the data strobe signal N_DQS. The data strobe signal N_DQS to be output has been generated from the data strobe signal H_DQS.

In response to start of the toggling of the data strobe signal N_DQS, the signal transfer circuit 112 sequentially reads 16-bit data signals from the FIFO memory 130. The second interface 102 generates a 16-bit data signal to be transferred by the DDR from 32-bit data signals sequentially read from the FIFO memory 130 and transferred by the SDR. Then, the second interface 102 outputs the data signal N_DQ[15:0], i.e., the 16-bit data signal to be transferred by the DDR, to the memory chip CP being a transmission destination. The second interface 102 outputs the data signal N_DQ[15:0] together with the data strobe signal N_DQS.

Further, in response to start of toggling of the data strobe signal N_DQS, the control circuit 123 starts counting the number of toggles of the data strobe signal N_DQS (S406).

The control circuit 123 determines whether or not the count of the number of toggles of the data strobe signal H_DQS matches the value corresponding to the size information 115 (S407). This processing corresponds to determining completion or incompletion of the toggling of the data strobe signal H_DQS, in other words, completion or incompletion of the input of the data signal H_DQ[7:0]. After determining that the count of the number of toggles of the data strobe signal H_DQS does not match the value corresponding to the size information 115 (NO in S407), the control circuit 123 performs the processing of S407 again.

After determining that the count of the number of toggles of the data strobe signal H_DQS matches the value corresponding to the size information 115 (YES in S407), the control circuit 123 controls the selector SEL20 to start inputting the oscillator clock to the PLL 121, and controls the gating circuit 124 to start interrupting the data strobe signal N_DQS (S408).

Through the processing of S408, the PLL 121 transitions from the locked state to the unlocked state. After a while, the PLL 121 enters the locked state again. The control circuit 123 determines whether or not the PLL 121 is in the locked state (S409).

Determination on the locked state of the PLL 121 can be made by any method. After determining that the PLL 121 is not in the locked state (NO in S409), the control circuit 123 performs the processing of S409 again.

After determining that the PLL 121 is in the locked state (YES in S409), the control circuit 123 controls the gating circuit 124 to cancel the interruption of the data strobe signal N_DQS (S410). As a result, the output of the data strobe signal N_DQS is resumed. This data strobe signal N_DQS to be output has been generated with reference to the oscillator clock.

The control circuit 123 determines whether or not the count of the number of toggles of the data strobe signal N_DQS matches the value corresponding to the size information 115 (S411). This processing corresponds to determining whether or not all the received data as the data signals H_DQ[7:0] has been output to the memory chip CP. After determining that the count of the number of toggles of the data strobe signal N_DQS does not match the value corresponding to the size information 115 (NO in S411), the control circuit 123 performs the processing of S411 again.

After determining that the count of the number of toggles of the data strobe signal N_DQS matches the value corresponding to the size information 115 (YES in S411), the control circuit 123 stops the output of the data strobe signal N_DQS (S412), completing the series of operations.

FIG. 7 is a timing chart illustrating an exemplary state transition of the respective signals during the series of operations illustrated in FIG. 6 according to an embodiment. In FIG. 7, the oscillator clock is multiplied in frequency by two by a multiplier (not illustrated in FIG. 2) and input to the PLL 121, as an example.

For example, before the data strobe signal H_DQS transitions from the H-level to the L-level (for example, time t0 in FIG. 7), the PLL 121 generates the PLL clock using the oscillator clock as the reference clock. The frequency divider 122 generates the frequency-divider clock from the PLL clock, which is generated with reference to the oscillator clock.

In response to the transition of the data strobe signal H_DQS from the H-level to the L-level (time t1), the control circuit 123 performs the processing of S402 and S403 (see FIG. 6). Thereby, the reference clock of the PLL 121 is switched from the oscillator clock to the data strobe signal H_DQS and the interruption of the data strobe signal N_DQS starts. The data strobe signal N_DQS is fixed at the L-level while the data strobe signal N_DQS is being interrupted.

At time t2, the toggling of the data strobe signal H_DQS and the input of the data signal H_DQ[7:0] start. The PLL 121 operates to enter the locked state such that the PLL clock is in synchronization with the data strobe signal H_DQS in phase.

The PLL 121 enters the locked state (time t3), and the control circuit 123 performs the processing of S405 (see FIG. 6). As a result, the output of the data strobe signal N_DQS and the data signal N_DQ[15:0] starts.

Received data as the data signal H_DQ[7:0] from the host HA from the time t2 to the time t3 is accumulated in the FIFO memory 130. That is, the FIFO memory 130 is required to have a large capacity sufficient to store all the data received from the host HA from start of the input of the data signal H_DQ[7:0] to cancellation of the interruption of the data strobe signal N_DQS after the PLL 121 enters the locked state. The designer finds, by experiment or calculation, the data size to be received from the host HA in the period from the start of the input of the data signal H_DQ[7:0] to the PLL 121's entering the locked state, to design the FIFO memory 130 with a capacity matching or exceeding the found data size.

The output of the data strobe signal N_DQS and the data signal N_DQ[15:0] starts at time t3. The frequency divider 122 sets the frequencies of the data strobe signal N_DQS and the data signal N_DQ[15:0] to half the frequencies of the data strobe signal H_DQS and the data signal H_DQ[7:0], respectively.

After completion of the toggling of the data strobe signal H_DQS and the input of the data signal H_DQ[7:0] (time t4), the control circuit 123 performs the processing of S408 (see FIG. 6). As a result, the reference clock of the PLL 121 is switched from the data strobe signal H_DQS to the oscillator clock. Further, the interruption of the data strobe signal N_DQS starts. The data strobe signal N_DQS is fixed at the L-level while being interrupted.

By the switch of the reference clock of the PLL 121 from the data strobe signal H_DQS to the oscillator clock, the PLL 121 operates to enter the locked state such that the PLL clock is in synchronization with the oscillator clock in phase.

The PLL 121 enters the locked state again (time t5). The control circuit 123 performs the processing of S410 (see FIG. 6). As a result, the output of the data strobe signal N_DQS and the output of the data signal N_DQ[15:0] are resumed.

At time t4 when the toggling of the data strobe signal H_DQS and the input of the data signal H_DQ[7:0] are completed, data having not been output to the memory chip CP remains stored in the FIFO memory 130 (and a pipeline if included in the signal transfer circuit 112). At time t5, the output of the remaining data starts.

During the period from the time t4 to the time t5, the PLL 121 is in the unlocked state. The bridge chip BC may be configured to be able to output the data strobe signal N_DQS during this period. In this case, however, the quality of the data strobe signal N_DQS cannot be assured. The signal transfer circuit 112 waits for the PLL 121 to enter the locked state and then resumes outputting the data strobe signal N_DQS. Thus, the bridge chip BC can output the data strobe signal N_DQS with high quality even during the non-input period of the data signal H_DQ[7:0](for example, the period after time t4 in FIG. 7).

The data strobe signal N_DQS output after time t5 is generated with reference to the oscillator clock. The data strobe signal N_DQS higher in frequency than the data strobe signal H_DQS may cause the memory chip CP as a transmission destination to err in setup timing. In order to prevent occurrence of timing error, the designer may select the oscillator 120 that can output the data strobe signal N_DQS after the time t5 at a slightly lower frequency than the data strobe signal H_DQS.

As described above, the embodiments include the following processing. That is, the size information 115 being numerical information, which represents the size of data to be transferred between the host HA and the memory chip CP, is stored in the register 114. The first interface 101 serving as a first interface circuit receives the data strobe signal H_DQS as a data transfer timing signal. The oscillator 120 serving as an oscillation circuit generates the oscillator clock. The PLL 121 as a phase-locked loop circuit generates the PLL clock. In response to the toggling of the data strobe signal H_DQS, the control circuit 123 inputs the data strobe signal H_DQS to the PLL 121 and counts the number of toggles of the data strobe signal H_DQS. At the time when the count of the number of toggles of the data strobe signal H_DQS matches the value corresponding to the size information 115, the control circuit 123 inputs the oscillator clock to the PLL 121. The second interface 102 as a second interface circuit transmits, to the memory chip CP, the data strobe signal N_DQS corresponding to the PLL clock, which is generated by the PLL 121 with reference to the data strobe signal H_DQS or the oscillator clock.

Consequently, the memory chip CP can receive the data strobe signal with less jitter than the one transferred from the bridge chip BC as it is. In other words, it is made possible to suppress the jitter in the data strobe signal serving as the data transfer timing signal.

The above embodiments have described the data strobe signal DQS transferred from the host HA to the memory chip CP as an example of the timing signal to be suppressed in jitter. The embodiments are applicable to timing signals other than the data strobe signal DQS transferred from the host HA to the memory chip CP.

As one example, the embodiments are applicable to the data strobe signal DQS that the memory chip CP transmits as a timing signal at the time of data transfer to the host HA. That is, the memory chip CP corresponds to the first device, and the host HA corresponds to the second device. In this case, in order to transfer the data strobe signal DQS and the data signal DQ to be transmitted by the memory chip CP, the first interface 101 functions as the second interface circuit, and the second interface 102 functions as the first interface circuit. In such a case, transmission/reception circuitry that transfers the data strobe signal DQS and the data signal DQ from the second interface 102 to the first interface 101 may be additionally provided.

For another example, the above embodiments are applicable to the read enable signal RE/REn serving as a timing signal that the host HA transmits to the memory system SYS at the time of reading data from the memory system SYS. In this case, the PLL 121 generates a PLL clock from the read enable signal RE/REn, and the second interface 102 transmits a new read enable signal RE/REn corresponding to the generated PLL clock to the memory chip CP.

According to one embodiment, the control circuit 123 interrupts the data strobe signal N_DQS by controlling the gating circuit 124 at first timing (for example, see time t4 in FIG. 7) at which the input of the oscillator clock to the PLL 121 starts. The control circuit 123 controls the gating circuit 124 to cancel the interruption of the data strobe signal N_DQS at second timing (for example, see time t5 in FIG. 7) after the first timing and after the PLL 121 enters the locked state.

As a result, the control circuit 123 can prevent transmission of the data strobe signal N_DQS, serving as a clock corresponding to the PLL clock generated by the PLL 121 in the unlocked state, to the memory chip CP. That is, the control circuit 123 can prevent use of a signal with no quality assurance as the data strobe signal N_DQS.

According to one embodiment, the control circuit 123 starts inputting the data strobe signal H_DQS to the PLL 121 in response to the level change, i.e., transition of the data strobe signal N_DQS (for example, see S401 and S402 in FIG. 6 and time t1 in FIG. 7). By controlling the gating circuit 124, the control circuit 123 interrupts the data strobe signal N_DQS at third timing (for example, see the time t1 in FIG. 7) at which the control circuit 123 starts inputting the data strobe signal H_DQS to the PLL 121. The control circuit 123 then controls the gating circuit 124 to cancel the interruption of the data strobe signal N_DQS at fourth timing (for example, see time t3 in FIG. 7) after the third timing and after the PLL 121 enters the locked state.

As a result, the control circuit 123 can prevent transmission of the data strobe signal N_DQS, as a clock corresponding to the PLL clock generated by the PLL 121 in the unlocked state, to the memory chip CP. That is, the control circuit 123 can prevent use of a signal with no quality assurance as the data strobe signal N_DQS.

According to one embodiment, the FIFO memory is disposed between the first interface 101 and the second interface 102. The first interface 101 receives the data signal DQ representing data and inputs it to the FIFO memory 130 in synchronization with the data strobe signal H_DQS. The second interface 102 acquires data from the FIFO memory 130 and transmits the acquired data to the memory chip CP in synchronization with the data strobe signal N_DQS.

This makes it possible for the bridge chip BC to buffer the data received during the interruption period of the data strobe signal N_DQS, that is, the period from the third timing (for example, see time t1 in FIG. 7) to the fourth timing (for example, see time t3 in FIG. 7).

Furthermore, according to one embodiment, the FIFO memory 130 has a capacity equal to or larger than the data size to receive during the period from the third timing (for example, see time t1 in FIG. 7) to the fourth timing (for example, see time t3 in FIG. 7).

That is, the bridge chip BC can buffer the data received after the interruption period of the data strobe signal N_DQS.

For the sake of comparison with the embodiments, use of only the oscillator clock as the reference clock of the PLL 121 is conceivable. This method is referred to as a comparative example. In the case of using the oscillator clock as the reference signal of the PLL 121, it is difficult to allow the data transfer rate between the host HA and the bridge chip BC to match the data transfer rate between the bridge chip BC and the memory chip CP. At a slightly higher data transfer rate between the host HA and the bridge chip BC than that between the bridge chip BC and the memory chip CP, data of a size proportional to the product of the difference between these data transfer rates and the transfer length of the data may be accumulated in the bridge chip BC. In other words, the comparative example may require a large-capacity FIFO memory.

According to one embodiment, it is sufficient for the FIFO memory 130 to have a capacity large enough to store at least data received during the interruption period of the data strobe signal N_DQS. Thus, the FIFO memory 130 of the embodiment can decrease in required capacity from the comparative example.

Furthermore, according to one embodiment, the first interface 101 can receive a command (for example, the set feature command) for writing the size information 115 to the register 114, as described with reference to FIGS. 4 and 5. This command is referred to as a first signal. The bridge chip BC writes the size information 115 to the register 114 in accordance with the first signal.

As described with reference to FIGS. 4 and 5, the first interface 101 can receive a switching signal for the operation mode of the bridge chip BC, such as the bridge chip enable signal BRG_CEn or the bridge control command. The switching signal for the operation mode of the bridge chip BC is referred to as a second signal. As described with reference to FIGS. 3, 4, and 5, the first interface 101 can also receive various commands such as the first signal and a command addressed to the memory chip CP. The first signal, the command addressed to the memory chip CP, and the like are collectively referred to as a third signal.

According to one embodiment, the second interface 102 transmits a fourth signal corresponding to the third signal to the memory chip CP in response to receipt of the third signal by the first interface 101. The fourth signal may be equivalent to the third signal or may be a signal generated from the third signal by the command decoder 111. In response to receipt of the second signal before the third signal by the first interface 101, the second interface refrains from transmitting the third signal to the memory chip CP.

That is, by transmitting the second signal before the first signal, the host HA can prevent the memory chip CP from malfunctioning due to the first signal. As a result, no time for the host HA to wait for the completion of the malfunction will occur. The host HA can thus promptly transmit the next command addressed to the memory chip CP after transmitting the first signal, heightening the data transfer rate between the host HA and the multiple memory chips CP.

The host HA may not transmit the second signal before the first signal. That is, the host HA may transmit the command for writing the size information 115 to the register 114 during the non-bridge control mode of the bridge chip BC. In addition, the bridge chip BC may not be configured to be operable in the bridge control mode. In short, the writing method of the size information 115 to the register 114 can be freely set.

According to one embodiment, as illustrated in FIG. 1, the bridge chip BC includes a dedicated terminal that receives the bridge chip enable signal BRG_CEn as the second signal. The terminal for receiving the bridge chip enable signal BRG_CEn is independent of the other terminals for transmitting and receiving commands, data, and addresses. The other terminals refer to a terminal group serving to transfer the chip enable signal CEn, the command latch enable signal CLE, the address latch enable signal ALE, the write enable signal WEn, the read enable signal RE/REn, the data strobe signal H_DQS, the data signal H_DQ, and the ready/busy signal R/Bn, for example.

It is thus made possible to switch the operation mode of the bridge chip BC without use of the vendor-specific command values.

Alternatively, the bridge chip BC of one embodiment includes a terminal capable of receiving both of the second signal serving as the bridge control command and the third signal representing various commands. The terminal capable of receiving both of the second signal representing the bridge control command and the third signal representing various commands is, for example, a terminal group that transfers the chip enable signal CEn, the command latch enable signal CLE, the address latch enable signal ALE, the write enable signal WEn, the read enable signal RE/REn, the data strobe signal H_DQS, the data signal H_DQ, and the ready/busy signal R/Bn.

Thus, without the dedicated terminal, the operation mode of the bridge chip BC can be switched by assigning one of the vendor-specific command values to the bridge control command.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a register configured to store numerical information, the numerical information representing a size of first data to be transferred between a first device and a second device;
a first interface circuit configured to receive, from the first device, a first timing signal for transfer of the first data;
an oscillation circuit configured to generate a first clock;
a phase-locked loop circuit configured to generate a second clock;
a control circuit configured to:
in response to start of toggling of the first timing signal, input the first timing signal to the phase-locked loop circuit and count the number of toggles of the first timing signal, and
input the first clock to the phase-locked loop circuit when a count of the number of toggles of the first timing signal matches a value corresponding to the numerical information; and
a second interface circuit configured to transmit the first timing signal or a second timing signal to the second device, the second timing signal corresponding to the second clock generated by the phase-locked loop circuit with reference to the first clock.

2. The semiconductor integrated circuit according to claim 1, wherein the control circuit is further configured to:

interrupt the second timing signal at a first timing at which the control circuit starts inputting the first clock to the phase-locked loop circuit, and cancel interruption of the second timing signal at a second timing after the first timing and after the phase-locked loop circuit enters a locked state.

3. The semiconductor integrated circuit according to claim 1, wherein the first timing signal is changed in level before the start of toggling of the first timing signal, and the control circuit is further configured to:

start inputting the first timing signal to the phase-locked loop circuit in response to the change in the level of the first timing signal, interrupt the second timing signal at a third timing at which the control circuit starts the inputting the first timing signal to the phase-locked loop circuit, and cancel interruption of the second timing signal at a fourth timing after the third timing and after the phase-locked loop circuit enters a locked state.

4. The semiconductor integrated circuit according to claim 3, further comprising:

a first-in first-out (FIFO) memory disposed between the first interface circuit and the second interface circuit, wherein the first interface circuit is configured to input the first data to the FIFO memory in synchronization with the first timing signal, and the second interface circuit is configured to acquire the first data from the FIFO memory in synchronization with the second timing signal, and transmit the acquired first data to the second device in synchronization with the second timing signal.

5. The semiconductor integrated circuit according to claim 4, wherein the FIFO memory has a capacity equal to or larger than a size of second data of the first data, the second data being to be received by the first interface circuit in a period from the third timing to the fourth timing.

6. The semiconductor integrated circuit according to claim 1, wherein the first interface circuit is configured to receive a first signal different from the first timing signal, and write the numerical information to the register in accordance with the first signal.

7. The semiconductor integrated circuit according to claim 6, wherein the first interface circuit is capable of receiving a second signal and a third signal, the third signal including the first signal, the second interface circuit is configured to transmit a fourth signal to the second device in response to receipt of the third signal by the first interface circuit, the fourth signal corresponding to the third signal and in response to receipt of the second signal before the third signal by the first interface circuit, the second interface circuit is configured to refrain from transmitting the third signal to the second device.

8. The semiconductor integrated circuit according to claim 7, further comprising:

a first terminal configured to receive the second signal; and a second terminal configured to receive the third signal, the second terminal being different from the first terminal.

9. The semiconductor integrated circuit according to claim 7, further comprising a terminal capable of receiving both the second signal and the third signal.

10. A semiconductor storage device comprising:

a semiconductor integrated circuit connectable to a host; and a memory chip connected to the semiconductor integrated circuit, wherein the semiconductor integrated circuit comprises:

a register configured to store numerical information, the numerical information representing a size of first data to be transferred from the host to the memory chip;

a first interface circuit configured to receive, from the host, a first timing signal for transfer of the first data;

an oscillation circuit configured to generate a first clock;

a phase-locked loop circuit configured to generate a second clock;

a control circuit configured to:

in response to start of toggling of the first timing signal, input the first timing signal to the phase-locked loop circuit and count the number of toggles of the first timing signal, and input the first clock to the phase-locked loop circuit when a count of the number of toggles of the first timing signal matches a value corresponding to the numerical information; and a second interface circuit configured to transmit the first timing signal or a second timing signal to the memory chip, the second timing signal corresponding to the second clock generated by the phase-locked loop circuit with reference to the first clock.

11. The semiconductor storage device according to claim 10, wherein the control circuit is further configured to:

interrupt the second timing signal at a first timing at which the control circuit starts inputting the first clock to the phase-locked loop circuit, and cancel interruption of the second timing signal at a second timing after the first timing and after the phase-locked loop circuit enters a locked state.

12. The semiconductor storage device according to claim 10, wherein the first timing signal is changed in level before the start of toggling of the first timing signal by the host, and the control circuit is further configured to:

start inputting the first timing signal to the phase-locked loop circuit in response to the change in the level of the first timing signal, interrupt the second timing signal at a third timing at which the control circuit starts the inputting the first timing signal to the phase-locked loop circuit, and cancel interruption of the second timing signal at a fourth timing after the third timing and after the phase-locked loop circuit enters a locked state.

13. The semiconductor storage device according to claim 12, wherein the semiconductor integrated circuit further comprises a first-in first-out (FIFO) memory disposed between the first interface circuit and the second interface circuit, wherein the first interface circuit is configured to input the first data to the FIFO memory in synchronization with the first timing signal, and the second interface circuit is configured to acquire the first data from the FIFO memory in synchronization with the second timing signal, and transmit the acquired first data to the memory chip in synchronization with the second timing signal.

14. The semiconductor storage device according to claim 13, wherein
the FIFO memory has a capacity equal to or larger than a size of second data of the first data, the second data being to be received by the first interface circuit in a period from the third timing to the fourth timing.

15. The semiconductor storage device according to claim 10, wherein
the first interface circuit is configured to receives a first signal different from the first timing signal from the host, and
the semiconductor integrated circuit is configured to write the numerical information to the register in accordance with the first signal.

16. The semiconductor storage device according to claim 15, wherein
the first interface circuit is capable of receiving a second signal and a third signal, the third signal including the first signal,
the second interface circuit is configured to transmit a fourth signal to the memory chip in response to receipt of the third signal by the first interface circuit, the fourth signal corresponding to the third signal and
in response to receipt of the second signal before the third signal by the first interface circuit, the second interface circuit is configured to refrain from transmitting the third signal to the memory chip.

17. The semiconductor storage device according to claim 16, wherein the semiconductor integrated circuit further comprises:
a first terminal configured to receive the second signal; and
a second terminal configured to receive the third signal, the second terminal being different from the first terminal.

18. The semiconductor storage device according to claim 16, wherein the semiconductor integrated circuit further comprises:
a terminal capable of receiving both the second signal and the third signal.

19. A control method for a semiconductor integrated circuit to be disposed between a first device and a second device, the method comprising:
storing, in a register, numerical information representing a size of first data to be transferred between the first device and the second device;
receiving, from the first device, a first timing signal for transfer of the first data;
generating a first clock;
in response to start of toggling of the first timing signal, generating a second clock synchronized with the first timing signal in phase, and transmitting a second timing signal corresponding to the second clock to the second device;
counting the number of toggles of the first timing signal; and
generating a third clock synchronized with the first clock in phase, and transmitting a third timing signal corresponding to the third clock to the second device when a count of the number of toggles of the first timing signal matches a value corresponding to the numerical information.

20. The control method according to claim 19, wherein the transmitting the third timing signal to the second device comprises:
inputting the first clock to a phase-locked loop circuit to start generating the third clock;
interrupting the third timing signal at a first timing at which the inputting the first clock to the phase-locked loop circuit starts; and
canceling interruption of the third timing signal at a second timing after the first timing and after the phase-locked loop circuit enters a locked state.

* * * * *